United States Patent [19]

Takano et al.

[11] Patent Number: 5,631,931
[45] Date of Patent: May 20, 1997

[54] BUS TYPE CLOCK SUPPLYING SYSTEM FOR PROVIDING A CLOCK IN A COMMUNICATION SYSTEM WITH A PLURALITY OF CLOCK BUS LINES

[75] Inventors: Masataka Takano; Toshihide Fujio, both of Yokohama, Japan

[73] Assignees: Hitachi, Ltd., Tokyo; Hitachi Communication Systems, Inc., Yokohama, both of Japan

[21] Appl. No.: 219,525

[22] Filed: Mar. 29, 1994

[30] Foreign Application Priority Data

Mar. 29, 1993 [JP] Japan .................................. 5-069749

[51] Int. Cl.⁶ .................................................. H04B 7/12
[52] U.S. Cl. ..................... 375/347; 375/357; 375/356; 455/133; 455/73; 395/556
[58] Field of Search ................ 364/DIG. 1, DIG. 2; 375/109, 111, 347; 370/100.1; 395/550

[56] References Cited

U.S. PATENT DOCUMENTS

| | | | |
|---|---|---|---|
| 3,769,607 | 10/1973 | Thellen | 331/2 |
| 4,229,699 | 10/1980 | Frissell | 328/63 |
| 4,233,682 | 11/1980 | Liebergot et al. | 371/68 |
| 4,239,982 | 12/1980 | Smith et al. | 307/219 |
| 4,282,493 | 8/1981 | Moreau | 331/2 |
| 4,504,942 | 3/1985 | Aro et al. | 370/58 |
| 4,707,142 | 11/1987 | Baker et al. | 368/46 |
| 4,723,120 | 2/1988 | Petty, Jr. | 340/825.02 |
| 4,876,683 | 10/1989 | Suzuki | 370/97 |
| 4,955,020 | 9/1990 | Stone et al. | 370/85.9 |
| 4,987,591 | 1/1991 | Ohtsuka | 379/279 |
| 5,059,925 | 10/1991 | Weisbloom | 331/1 A |
| 5,077,734 | 12/1991 | Ohtsuka | 370/100.1 |
| 5,373,254 | 12/1994 | Nakauchi et al. | 331/1 A |
| 5,388,100 | 2/1995 | Ohtsuka | 370/95.1 |

FOREIGN PATENT DOCUMENTS 4-174012  6/1992  Japan .

OTHER PUBLICATIONS

Easy Digital Exchange, published by Electric Communication Association, Jan. 1983, pp. 156–161.

*Primary Examiner*—Kevin A. Kriess
*Assistant Examiner*—Lucien Toplu
*Attorney, Agent, or Firm*—Fay, Sharpe, Beall, Fagan, Minnich & McKee

[57] ABSTRACT

A bus type clock supplying system in a communication system with master-slave synchronization includes communication cards connected with transmission lines within a communication system and a clock bus. Each communication card includes a clock supplying section including a frequency divider for extracting a clock from the transmission lines and a tri-state device outputting the clock to the clock bus; a clock receiving section including a clock selector for selecting one clock from a plurality of the bus-type clock lines, and a frequency multiplier for multiplying the frequency of the selected clock; and a monitoring and controlling section having a function of monitoring interruption of clock input, abnormalities in the frequency multiplier, etc., and a function of controlling the tri-state device and the clock selector.

4 Claims, 4 Drawing Sheets

BUS TYPE CLOCK SUPPLYING SYSTEM FOR PROVIDING A CLOCK IN A COMMUNICATION SYSTEM WITH A PLURALITY OF CLOCK BUS LINES

BACKGROUND OF THE INVENTION

1. Field of The Invention

The present invention relates to a bus type clock providing system in a communication system connected with a digital communication network and a method therefor.

2. Description of The Related Art

In a conventional digital communication network, when communication apparatuses having clocks of frequencies different from each other in the network communicate to each other, a so-called master-slave synchronization system, in which the different apparatuses are synchronized on the basis of a clock sent from a central processing unit (CPU) supervising and controlling the whole network, has been adopted as one of frequency synchronizing techniques.

As described in Shinichi Aizawa, "Yasasii Digital Kokan (Easy Digital Exchange)" (published by Denki Tsushin Kyokai (Electric Communication Association) on January, 1983), pp. 156-161 (in Japanese), the system for supplying clocks to communication apparatuses in a digital communication network provides an independent doubled network clock device (NCLK) and clocks are supplied to necessary portions of communication apparatuses connected with the clock device in star form.

FIG. 4 shows an example indicating the structure of a conventional clock supplying system using the doubled clock device.

The conventional doubled clock supplying system is so constructed that a reference clock is supplied from the doubled network clock supplying device (NCLK), in which two clock cards 15 and 15' function complimentarily as an act system and a standby system, respectively, to a plurality of communication cards (communication packages) 14. Here, each of the communication cards includes a receiving circuit section 6 and a transmitting circuit section 7, which receive and transmit data from and to apparatuses connected therewith through transmission lines.

Each of the clock cards 15 and 15' includes a dependent clock selector 16 or 16' working to select a predetermined dependent clock indicated by the central processing unit, not shown in the figure, among a plurality of clocks, which are extracted from transmission lines connected with the relevant communication cards 14 and sent to the relevant clock card through a frequency divider 8, and a phase locked loop circuit (PLL) 17 or 17'. The phase locked loop circuit (PLL) 17 is cross-connected through a clock card system cross-connecting line 18 with the phase locked loop circuit (PLL) 17' in the other clock card system connected complimentarily therewith and constructed so as to be able to select a transmission line before switching-over, when the act system/standby system in the network clock device is switched-over from each other.

The communication card 14 of the conventional system, in which the reference clock is supplied from the network clock device, is composed of a receiving circuit section 6, a transmitting circuit section 7 having a function of terminating a physical layer of the transmission line, a frequency dividing circuit 8, which divides the frequency of the clock extracted from a line connected with the communication card to obtain the reference clock having the frequency of the clock bus, a frequency multiplying circuit (including PLL, phase locked loop circuit) 12, which multiplies the frequency of the reference clock to obtain a frequency necessary for the communication card, and a clock monitoring and controlling circuit 13 for detecting PLL troubles, etc., in the frequency multiplying circuit such as interruption of clock input, deviation between the outputted clock and the inputted clock in phase, and interruption of clock output.

This communication card 14 is so constructed that the clock receiving section receiving the clock from the NCLK 19 selects the reference clock, which is either one of two sorts of the act system/standby system, through the clock monitoring and controlling circuit 13.

Since the reference clock supplying system in the conventional communication system is constructed as described above, it has following problems.

(1) In order to secure reliability of the clock, it is necessary to double the clock and therefore two systems of clock cards independent from each other, i.e. an act system and a standby system are required;

(2) Since the clock cards are doubled in the network clock device, it is necessary to control the doubled clock cards;

(3) PLLs for stabilizing the clock are required both in the clock card and in the communication card; and (4) Since a plurality of communication cards are connected with the network clock device in star form, when many communication cards are installed and the number of dependent clock sources increases, a number of clock lines are required for inputting dependent clocks to the dependent clock selector 16. In this case, when setting of the priority of the dependent clocks is effected by hardware, the connection of the dependent clock selector is also complicated. Furthermore another problem is that the clock supplying circuit in a communication apparatus installed in the network is complicated, such as the number of lines connecting the phase locked loop circuits 17 and 17' in the network clock device with the clock monitoring device 13 in every communication card is increased, etc.

SUMMARY OF THE INVENTION

As described above, the conventional clock supplying system required a doubled clock supplying device including clock selecting circuits, phase locked loop circuits, etc. exclusively used for supplying clocks and wires were necessary for supplying clocks from a plurality of clock supplying sources to the relevant clock selecting circuits. In addition, when the number of circuits capable of being clock sources increased, the scale of the clock selecting circuit and the number of wires increased together therewith and thus there was a problem that the circuit was complicated.

In view of the problems described above, the object of the present invention is to provide a clock supplying method, by which the scale of the circuit remains unchanged, even if the number of clock sources increases.

The present invention distributes a plurality of clock sources on a plurality of communication cards. The reference clocks outputted from respective communication cards are applied to bus type clock supply lines. Each communication card obtains the clock for data communication by selecting a clock from the clock supply lines. The present invention provides a small-size, low-cost clock supplying system without having the circuit for clock supply only.

In order to achieve the above object, a clock supplying system in a communication system of so-called master-slave synchronization, which communicates with other communication systems, extracts clocks from a plurality of transmission lines, and works in synchronism with either one of the clocks, provides a clock supplying section for outputting the clock from the transmission line of the communication system to a bus-like clock line on each communication card connecting transmission lines. In the system, there are bus-like clock lines. In each communication card, there is a clock receiving section for receiving a plurality of clocks from the bus-like clock lines and a monitoring and controlling section for monitoring the state around the connecting section. A tri-state device outputs the clocks extracted from the transmission line to the bus-like clock line in the clock supplying section. A clock selector selects one clock among a plurality of clocks extracted from a plurality of respective transmission lines, to which clocks are inputted from the bus-like clock line, in the clock receiving section. A monitoring function is provided for monitoring abnormalities. A function is provided for controlling ENABLE of the tri-state device of the clock supplying section. A function of indicating is provided to select the bus-like clock line in the monitoring and controlling section.

Further, in the bus type clock supplying system in the communication system, there are disposed in each communication card a frequency divider for dividing the frequency of the clock extracted from the transmission line to obtain the reference frequency in the clock supplying section and a frequency multiplier for multiplying the frequency of the inputted reference clock provided from the bus type clock line to obtain a frequency necessary to communication in the clock receiving section. Further, in the case where a communication system includes a plurality of communication cards having different communication speeds, a frequency common to all the cards within the communication system is determined as a reference frequency, which is optimum for the frequency multipliers in the respective communication cards generating frequencies necessary for communication.

As a modified example, in the bus-like clock line in the bus type clock supplying system in the communication system, there is disposed a independent synchronizing clock line, to which a clock from a clock oscillator in each communication card is outputted, in addition to a master-slave synchronizing clock line, to which a clock extracted from a transmission line is outputted.

In this clock supplying system, the clock output from a clock source to the clock bus is controlled by connecting an output of each clock source with a bus-like clock line through a tri-state device within a communication card and setting ENABLE of the tri-state device.

In the receiving section of the clock bus within each communication card, there is disposed a selector for selecting either one of a plurality of clock lines and the selector in each communication card is controlled by a central processing unit. The output of the selector is connected with the frequency multiplier (including phase locked loop circuit, PLL) and the output thereof is used for the clock in the communication card. In each communication card, there is a circuit for detecting troubles such as input clock interruption in the PLL, deviations between the output and the input in the PLL in phase, and output interruption and the selector is controlled so as to select either one of the clock lines according to results of the trouble detection by the detecting circuit.

In each communication card, there is disposed a frequency multiplier in the clock receiving section; the frequency for the clock bus is set so as to be optimum for multiplying it to obtain respective frequencies necessary for respective communication card; and there is disposed a frequency divider in the clock supplying section for dividing the clocks extracted from the transmission lines to obtain the frequency for the clock bus, and it is possible as the result to keep the number of clock bus lines as small as possible, to lower the common reference frequency, to reduce noise on the bus and to increase the length of the bus.

Further a transmission line clock extracting circuit for the master-slave synchronization, an extracted clock dividing circuit for dividing the extracted clocks to obtain the frequency for the clock bus, a tri-state device for outputting the clock to the clock bus, a control circuit for controlling the ENABLE of the tri-state device, a receiver side clock bus selecting circuit, a clock multiplying circuit for multiplying the frequency for the clock bus to obtain frequencies necessary for communication, a monitoring circuit for monitoring clock input interruption on the receiver side of the clock bus, abnormalities in the multiplier, etc., and a control circuit for selecting either one of bus-like clock lines are dispersedly arranged within each communication card, and the exclusive, independent device for supplying clock can be eliminated.

DESCRIPTION OF THE PREFERRED EMBODIMENTS (1) Structure

Hereinbelow a bus type clock supplying system in a communication system according to the present invention will be explained, referring to the figures.

Here a communication system is a system, in which a plurality of apparatuses receive and transmit data within a network. For example, it is a multiplexer (MUX), an exchanger, etc.

Figure 1:
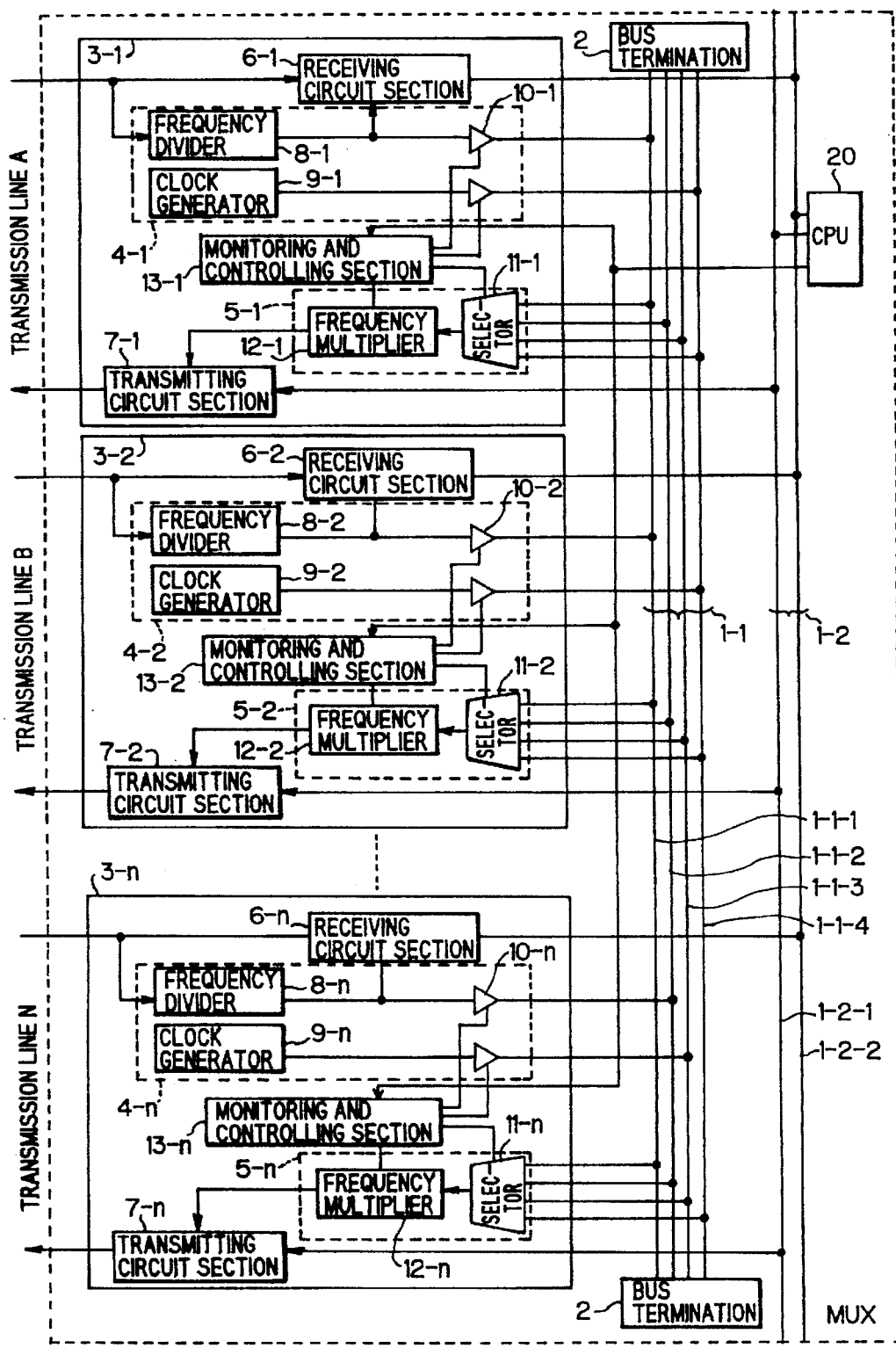
FIG. 1 is a diagram showing an embodiment of the communication system, to which a clock supplying system according to the present invention is applied.
Figure 2:
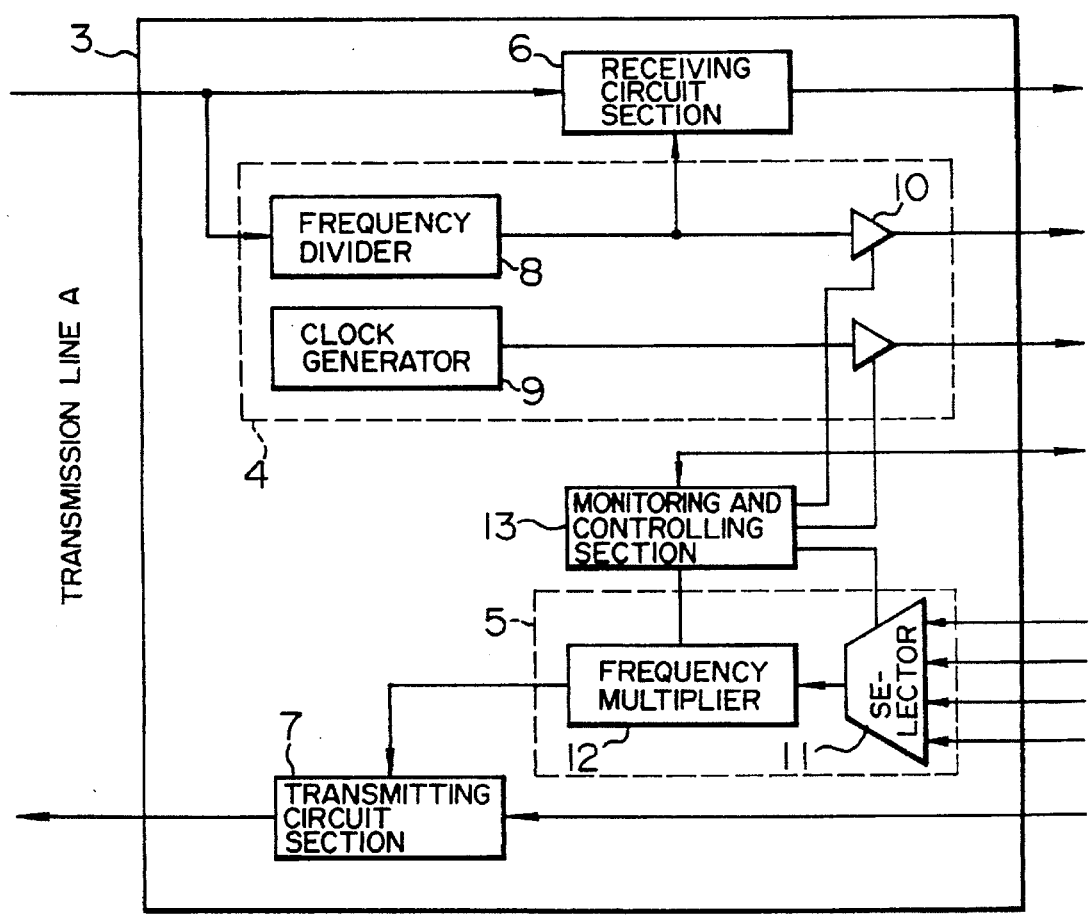
FIG. 2 is a diagram showing the structure of a communication card, to which the clock providing system according to the present invention is applied.

FIG. 1 is a diagram showing the structure of a bus type clock supplying system, in which communication cards in an MUX are connected with each other through clock bus lines and FIG. 2 is a diagram showing the structure of the communication card in detail.

The communication system, to which the clock supplying system according to the present invention is applied, includes a plurality of clock lines. A plurality of communication cards 3-1, 3-2, ..., 3-n are connected with a clock bus 1-1 terminated at both ends by clock bus terminating circuits 2. The respective communication cards are connected with a central processing unit (CPU) 20.

Clocks extracted from transmission lines are outputted through tri-state devices 10-1~10-n in the communication cards 3-1~3-n to a plurality of clock lines 1-1-1, 1-1-2, 1-1-3 and 1-1-4 within the clock bus 1-1. Here a tri-state device 10 acts as a switch and the state of the switch is controlled by the ENABLE terminal of the tri-state device.

As indicated in FIG. 2, each communication card 3 includes a receiving circuit section 6; a transmitting circuit section 7 having a function of terminating a physical layer of the transmission line; a frequency divider 8, which divides the frequency of the clock extracted from the transmission line to obtain a reference clock, which is the frequency for the clock bus; a quartz oscillator 9 generating a reference clock for independent synchronization; a clock outputting tri-state device 10 for outputting selectively the reference clock obtained by the frequency divider or by the quartz oscillator to the clock bus; a clock selector 11 for selecting the reference clock inputted from the clock bus to send it to a frequency multiplier in the succeeding stage; a multiplier 12 including a PLL circuit multiplying the frequency of the reference clock sent from the clock selecting selector to obtain a line frequency necessary for the communication card; and a clock monitoring and controlling circuit 13, which monitors the state of the inside and outside of the communication card, and detects the troubles of the clock in the multiplier (PLL), such as interruption of the clock inputted from the clock bus, deviations between the output clock and the input clock in the phase, output clock interruption, etc. and at the same time controls the clock outputting using the ENABLE of tri-state device and the clock selection using the clock selecting selector.

In this embodiment, the frequency divider 8, which extracts the clock from the transmission line and divides this clock frequency to obtain the clock bus frequency, and the tri-state device 10 constitute the clock supplying section 4, while the clock selector 11 and the multiplier 12 constitute the clock receiving circuit 5.

Operations thereof will be explained below. For example, supposing that a transmission line A of the communication card 3-1 is a connection route for the master clock, in the communication card 3-1, the clock extracted from the transmission line A is divided by the frequency divider 8-1 to obtain the frequency for the clock bus and is sent to the clock outputting tri-state device 10-1. The central processing unit CPU switches-on the ENABLE of the tri-state device through the monitoring and controlling means 13-1 so that the divided clock is outputted to the clock line 1-1-1 in the clock bus 1-1 as the reference clock. At the same time, the tri-state devices on the communication cards 3-2, ... 3-n connected to the clock line 1-1-1 except the card 3-1 are controlled so as to set the ENABLEs of the devices off so as not to output clocks.

The respective clock selectors 11-1 to 11-n in the communication cards 3-1, 3-2, 3-n are controlled by the CPU through the respective monitoring and controlling circuits 13-1 to 13-n. In this example, the clock line 1-1-1 in the clock bus 1-1, on which the master clock is transmitted, is selected and it is sent to the frequency multiplier 12-1~12-n in the respective communication cards.

The frequency multiplier (including PLL) 12 multiplies the frequency on the clock bus to obtain a frequency necessary for the relevant communication card to use it. Since the multiplier 12 using the PLL circuit doesn't generate disturbance in clock duty, clock missing and spring in the clock phase at switching-over of the clock bus, it has a function of preventing erroneous operation.

In this way, the transmission lines in the communication cards 3-2 to 3-n can also depend on the clock of the transmission line in the communication card 3-1.

(2) Switch-over of clocks

Now switch-over of the clocks will be explained.

For example, it is supposed that the tri-state device 10-1 in the communication card 3-1 is switched-on by controlling the ENABLE of the tri-state device and that the reference clock is provided from the communication card to the clock line 1-1-1 in the clock bus 1-1.

When the monitoring and controlling circuits 13-1 to 13-n in all communication cards 3-1 to 3-n connected with the clock bus detect the interruption of the clock inputted to the respective multipliers 12-1 to 12-n, they inform the CPU of the interruption. The CPU judges that any trouble takes place in the clock providing section 4-1 in the communication card 3-1 providing the clock, i.e. in the frequency divider 8-1 or the tri-state device 10-1.

As a first method, the CPU instructs through the monitoring and controlling circuits 13-1 to 13-n the respective communication cards 3-1 to 3-n to switch-over the clock selector 11-1 to 11-n in the respective communication cards to a clock on one of the other clock lines 1-1-x ($2 \leq x \leq n$) to which the reference clocks are outputted from other clock sources.

As a second method, the CPU switches-off the tri-state device 10-1 for clock output in the communication card 3-1 and switches-on the tri-state device 10-x ($2 \leq x \leq n$) in the communication card 3-x ($2 \leq x \leq n$) which is another clock source to supply the reference clock to the clock line 1-1-1, by controlling the ENABLES of the tri-state devices through the monitoring and controlling circuits 13-1 and 13-x in the communication cards so that a correct reference clock is outputted to the clock line 1-1-1.

As described above, the detection of abnormalities in the clock and the switch-over of the clock selectors in the respective communication cards or the clock output from an alternative clock source to the clock bus are effected instantaneously. Although noise is produced on the clock bus by this clock switch-over, it is eliminated by filtering function of the PLLs in the frequency multiplier 12-1 to 12-n in the respective communication cards.

Further, in the case where the clock monitoring and controlling circuit 13-x detects any trouble of PLL in the frequency multiplier such as the interruption of the clock inputted to the multiplier 12-x, the deviations between the output clock and the input clock of the multiplier in phase, or the interruption of the output clock, although they are not troubles on the clock supplying side, the same processing as described above is executed as the clock switching-over method. That is, the CPU switches-over the clock selectors of all communication cards to another clock line or switches-off the tri-state device in the communication card outputting the master clock and switches-on one of the tri-state devices in the other communication cards to sent a new reference clock to the clock bus.

(3) Accommodation of communication cards having different communication speeds

Next a case where a plurality of communication cards having different communication speeds are accommodated in a MUX will be explained, referring to FIG. 3.

Figure 3:
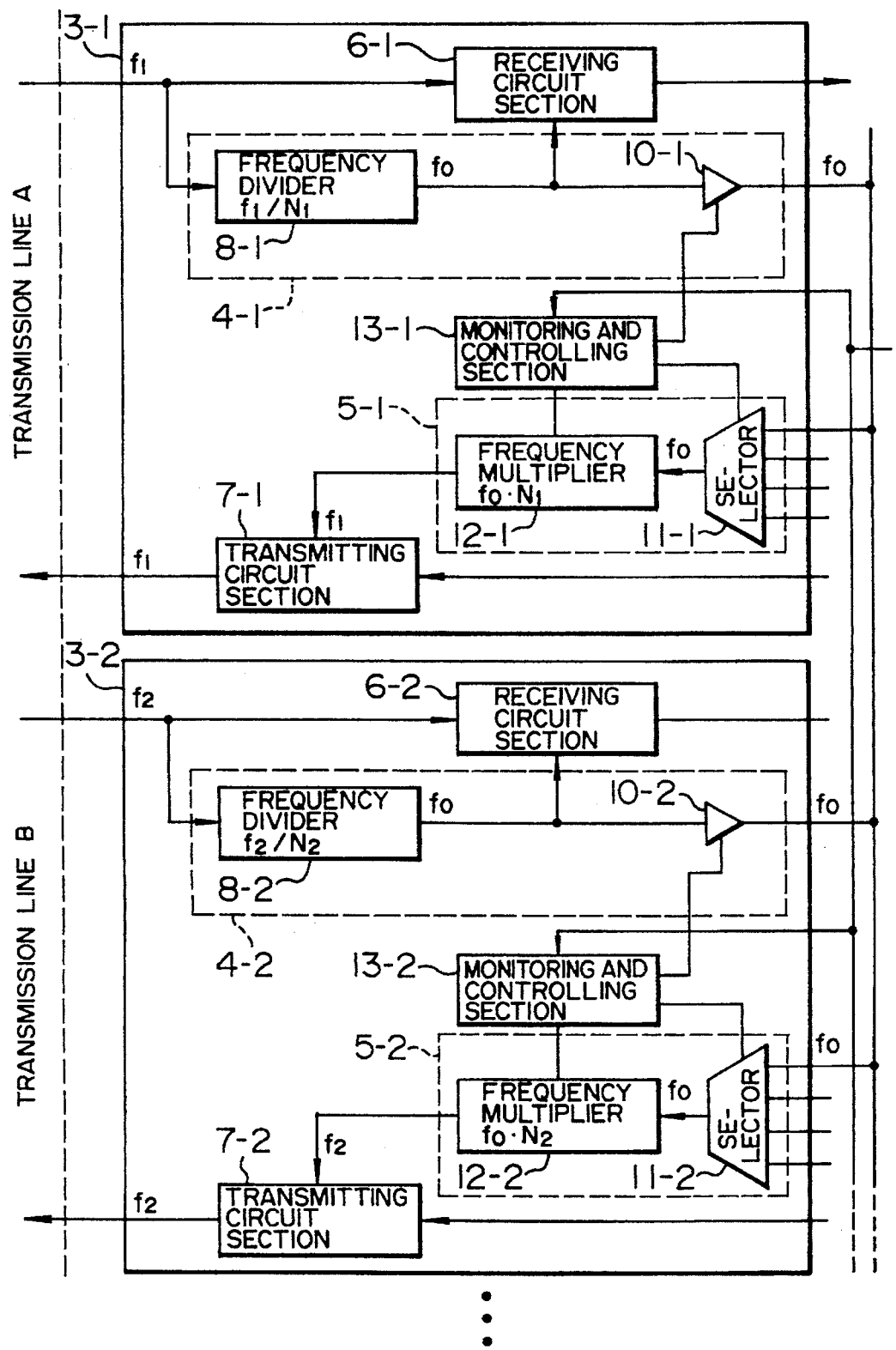
FIG. 3 is a diagram showing an embodiment, in which a plurality of communication cards having different communication speeds are installed, in a clock supplying system according to the present invention.
Figure 4:
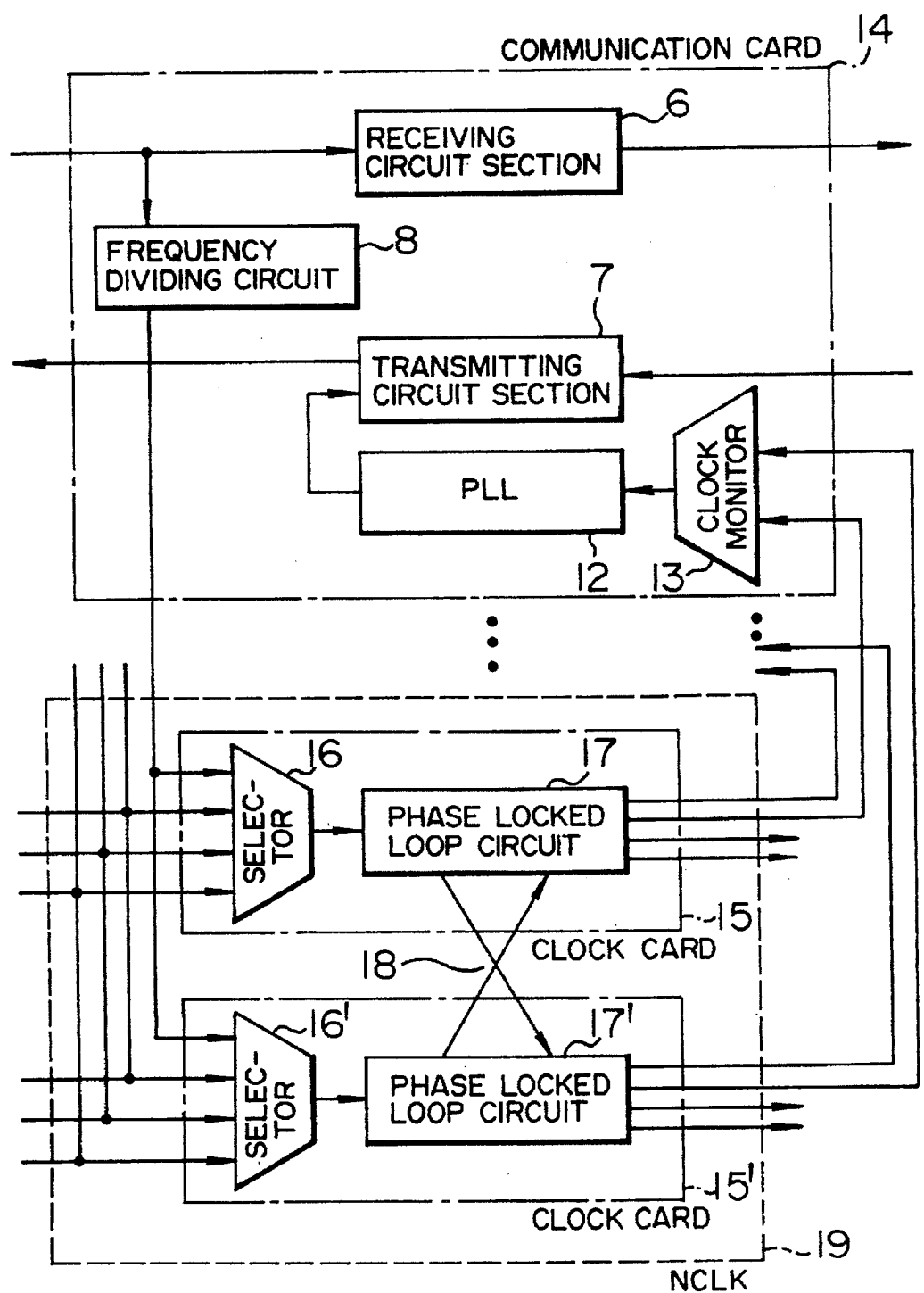
FIG. 4 is a diagram showing an example of a prior art clock providing system.

FIG. 3 shows an apparatus similar to the MUX indicated in FIG. 2, in which the communication cards 31 and 3-2 are shown. The structure of each of the communication cards is the same as the communication card indicated in FIG. 1 and the elements unnecessary for explanation are omitted.

In the figure, the communication card 3-1 working at a communication frequency f1 and the communication card 3-2 working at a communication frequency f2 are accommodated in the MUX. The communication cards extract clocks having the communication frequencies f1, e.g. 150 MHz, and f2, e.g. 120 MHz, from the respective transmission lines and the frequency dividers 8 divide the frequencies f1 and f2 of the extracted clocks with the respective frequency dividing ratios, until a frequency f0, e.g. 8 kHz, for the clock bus is obtained.

In the case of this embodiment, the communication card 3-1 includes the frequency divider 8-1, which divides the frequency f1 of the clock extracted from the transmission line A to obtain a frequency f0 which is 1/N1 (N1 is a natural number.) times as small as the former, and the frequency multiplier 12-1, which multiplies the frequency f0 of the reference clock to obtain the frequency f1 which is N1 times as great as f0. Similarly the communication card 3-2 includes the frequency divider 8-2, which divides the frequency f2 of the clock extracted from the transmission line B to obtain a frequency f0 which is 1/N2 (N2 is a natural number.) times as small as the former, and the frequency multiplier 12-2, which multiplies the frequency f0 of the reference clock to obtain the frequency f2 which is N2 times as great as f0.

The clocks of frequency f0 obtained by the frequency division in the respective communication cards are provided to the tri-state devices 10-1 and 10-2, respectively. The CPU selects either one of the tri-state devices 10-1 and 10-2 to switch-on it and outputs the clock having the frequency f0 to the clock bus as the reference clock.

In the clock receiving sections in the respective communication cards, after the clock selectors 11-1 and 11-2 have selected the reference clock having the frequency f0, the frequency multipliers 12-1 and 12-2 multiply the frequency f0 of the reference clock by N1 in the communication card 3-1 to obtain the clock having the frequency f1 which is the communication speed of the transmission A and by N2 in the communication card 3-2 to obtain the clock having the frequency f2 which is the communication speed of the transmission B.

That is, the frequency of the clock bus is determined to be the reference frequency common to the plurality of accommodated communication cards and all the frequency multipliers use the same frequency of the clock bus as the reference clock to obtain the desired working clocks f1 and f2.

In this way, by setting the clocks inputted to the frequency multipliers in the respective communication cards for the reference clock having the frequency f0 common to the all cards, when the reference clocks outputted by the communication cards are inputted to the clock selector in the communication cards, the clocks having frequencies f1, f2 and fn necessary for communication by the respective transmission lines can be obtained.

(4) Modification

Next several modified examples will be explained.

In the embodiment indicated in FIG. 1, each communication card includes a frequency divider 8 for extracting a clock from a receiving line and a clock generator 9 for generating a reference clock for independent synchronization. However, if this communication system does not use an independent synchronization system, this clock generator 9 and a tri-state device attached thereto are unnecessary.

In order that this communication system can use both the master-slave synchronization and the independent synchronization, a clock bus is utilized as indicated below.

For example, the clock lines 1-1-1 and 1-1-2 in the clock bus 1-1 are used for the master-slave synchronization and the clock line 1-1-3 is used for the independent synchronization. In the communication cards 3-1 and 3-2, the clocks extracted from the transmission lines A and B and divided by the frequency dividers are outputted to the clock lines 1-1-1 and 1-1-2 in the clock bus 1-1 through the respective tri-state devices 10-1 and 10-2. On the other hand, in the communication card 3-n the clock generated by the reference clock generating circuit 9-n is outputted to the clock line 1-1-3 in the clock bus through the tri-state device 10-n.

Owing to such a structure, in the respective communication cards accommodated in the MUX, the operation can be effected usually in synchronism with the reference clock outputted to the clock line 1-1-1 or 1-1-2 for the master-slave synchronization, dependent thereon and when troubles happen, in synchronism with the reference clock outputted from the communication card 3-n to the clock line 1-1-3 for the independent synchronization, independent from the network.

In a communication system having a plurality of communication cards, it is important for maintenance to be able to draw-out or insert respective communication cards without switching-off the power of the whole communication system. Also in the present embodiment, if a communication card is drawn out without switching-off the power of the whole communication system, some noise is produced on the clock bus. In the case where the drawn card is the clock supplying card, the temporary clock interrupt may take place. (However an alternative clock is supplied immediately by another card.) Influences of such noise on the clock bus or the temporary clock interrupt are almost completely absorbed by the PLLs of the frequency multipliers in the respective communication cards, when the communication cards take-in the clock. However, the further slight influences such as frequency variations remain. These influences of the frequency variations can be absorbed by providing an elastic memory in the transmitting circuit section in each communication card and thus it is possible to prevent erroneous operations of the communication cards.

It is a design problem how a plurality of clock sources on the communication cards and a plurality of clock lines should be connected. This is because, in the present embodiment, the connection between the clock and the clock line can be controlled by the tri-state device disposed in each of the clock providing sources, and further it can be decided by the clock selector disposed in each communication card which clock should be used from the plurality of clock lines. It is also a design problem which method is taken, the switch-over of the clock supplying source, or the selection change of the clock line, and which clock supplying source or clock line should be used alternatively, when any abnormality is found in a used clock. It is preferable to decide them, taking the reliability of the transmission lines and the probability of troubles taking place in the clock generator into account.

(5) Effect of the invention

As described above, in the clock supplying system according to the present invention, it is possible to select an arbitrary clock from a plurality of clock supplying sources and to have less clock supplying lines connected with clock selecting circuits using a clock bus than those used for star type connection. For this reason, it will be unnecessary to have a complicated, doubled clock section and to control the doubled clock section. In addition, since it is unnecessary to have any exclusive clock section, a remarkable effect can be obtained to reduce the size and the cost of the whole apparatus.

Further, since the clock supplying sources in the communication cards supply the clocks to the bus through the tri-state devices, a plurality of clock supplying sources can share one bus line and in this way it is possible to decrease the number of bus lines and also to make a selecting circuit simple, the circuit having a scale smaller than a star type clock supplying system.

In addition, no exclusive clock section within the communication system is required and it is possible to improve reliability of the communication system by distributing the functions, such as the clock supply and the clock selection to the respective communication cards. Further, by terminating both ends of the clock bus and making the frequency for the clock bus lower, the influences of the noise such as reflection, etc. can be prevented.

Since only the number of wires between the bus and the cards increases by adopting the clock bus, even when the number of clock supplying sources is increased, it is avoided that the whole circuit would be complicated. For this reason, it is possible to increase easily the number of clock supplying sources.

Furthermore by disposing a frequency multiplier in the clock receiving section and by setting the frequency for the clock bus at the optimum value it is possible to mount communication cards having different line frequencies on a same clock line.

What is claimed is:

1. A clock supplying system in a communication system within a digital communication network comprising:

(a) a central processing unit(CPU);

(b) a clock bus having a plurality of clock lines; and (c) a plurality of communication cards for transmitting and receiving data through transmission lines within said network, each of said communication cards comprising:

means for extracting a clock from one of said transmission lines;

first switching means for connecting said clock extracting means with one of said plurality of clock lines in said clock bus and for breaking connection therebetween;

selecting means, connected with all of said plurality of clock lines, for selecting a clock line from said plurality of clock lines to receive the clock; and monitoring and controlling means, connected with said selecting means, said first switching means and said CPU, for monitoring said clock and an input/output signal of said selecting means, wherein when where said monitoring and controlling means in any of said communication cards detects abnormalities in the output signal of said selecting means, said monitoring and controlling means informs said CPU thereof and said CPU issues an instruction for controlling said first switching means and said selecting means in all of said communication cards;

wherein said CPU controls said first switching means of each of said plurality of communication cards such that a single clock is provided to each of the plurality of clock lines; and wherein when an abnormality is detected by the monitoring and controlling means, the CPU either disconnects a first switching means of a first communication card currently providing the clock to the selected clock line and connects a first switching means of a second communication card to said selected clock line to provide a different clock to the selected clock line or controls the selecting means to select a different clock line.

2. A clock supplying system according to claim 1, wherein each communication card further comprises:

clock generating means for generating a clock; and second switching means for connecting said clock generating means with one of said plurality of clock lines and breaking connection therebetween, wherein said second switching means is connected to said monitoring and controlling means and is switched-over by said monitoring and controlling means in response to the instruction of said CPU, said first and second switching means each including a tri-state device.

3. A clock supplying system according to claim 1, wherein said clock extracting means in each of the communication cards includes frequency dividing means for dividing the frequency of the clock extracted from said transmission line and said selecting means includes a frequency multiplying means for multiplying the frequency of the selected and received clock.

4. A clock supplying system according to claim 3, wherein said frequency multiplying means in each of said communication cards includes a PLL (phase locked loop) circuit and each of said communication cards is provided with an elastic memory for temporarily storing transmitting data.

* * * * *